(12) United States Patent
Ascarrunz et al.

(10) Patent No.: US 7,064,608 B2
(45) Date of Patent: Jun. 20, 2006

(54) FEED-FORWARD-BACK SUPPRESSED NOISE CIRCUITS

(75) Inventors: Franklin G. Ascarrunz, Louisville, CO (US); Stefania Romisch, Jamestown, CO (US)

(73) Assignee: ScriptL, LLC, Louisville, CO (US)

( * ) Notice: Subject to any disclaimer, the term of this patent is extended or adjusted under 35 U.S.C. 154(b) by 0 days.

(21) Appl. No.: 10/721,941

(22) Filed: Nov. 25, 2003

(65) Prior Publication Data

US 2004/0104773 A1 Jun. 3, 2004

Related U.S. Application Data

(60) Provisional application No. 60/429,124, filed on Nov. 26, 2002.

(51) Int. Cl.
*H03F 1/00* (2006.01)

(52) U.S. Cl. .................................. 330/151; 330/149
(58) Field of Classification Search ................ 330/151, 330/149; 375/297; 455/63
See application file for complete search history.

(56) References Cited

U.S. PATENT DOCUMENTS

| | | | |
|---|---|---|---|
| 4,208,635 A | 6/1980 | Fazakerly et al. | |
| 4,230,953 A * | 10/1980 | Wilcox | 327/518 |
| 5,661,439 A | 8/1997 | Watkins et al. | |
| 5,760,646 A | 6/1998 | Belcher et al. | |
| 5,770,971 A | 6/1998 | McNicol | |
| 5,808,512 A | 9/1998 | Bainvoll et al. | |
| 6,011,434 A * | 1/2000 | Sakai | 330/151 |
| 6,087,898 A | 7/2000 | Baskin | |
| 6,091,303 A | 7/2000 | Dent | |
| 6,172,560 B1 * | 1/2001 | Yamashita et al. | 330/52 |
| 6,208,207 B1 * | 3/2001 | Cavers | 330/149 |
| 6,392,481 B1 | 5/2002 | Kurttio | |
| 6,400,223 B1 | 6/2002 | McLaren | |
| 6,456,160 B1 * | 9/2002 | Nakayama et al. | 330/52 |
| 6,850,739 B1 * | 2/2005 | Higuchi | 455/84 |
| 2002/0084845 A1 | 7/2002 | Eisenberg et al. | |
| 2002/0130716 A1 | 9/2002 | Larson et al. | |

* cited by examiner

*Primary Examiner*—Henry Choe
(74) *Attorney, Agent, or Firm*—Ancel W. Lewis, Jr.

(57) ABSTRACT

A noiseless amplifier circuit has an amplifier, a first circuit that isolates amplifier generated noise and provides the desired gain, a second circuit that cancels the amplifier generated noise from the output signal from the amplifier, a closed loop feedback third circuit that modulates the input signal to the amplifier to compensate for amplifier generated noise, and first and second controls that keep phase and amplitude balanced at a combiner in the first and second circuits, respectively. An oscillator circuit and a mixer circuit incorporate the noiseless amplifier circuits.

13 Claims, 2 Drawing Sheets

FEED-FORWARD-BACK SUPPRESSED NOISE CIRCUITS

This application claims the benefit under 35 U.S.C. § 119(e) of the U.S. provisional patent application No. 60/429,124 filed Nov. 26, 2002.

TECHNICAL FIELD

The present invention relates to electronic amplifiers and more particularly to an amplifier that provides noiseless amplification through signal superposition and modulation.

BACKGROUND ART

In electrical and electronic systems, the noise generated by amplification of a signal reduces the signal to noise ratio and creates a limitation in the creation of good-quality high-power RF signals.

Elimination of the noise generated by amplification of a signal is valuable in many applications, including communications, military applications and measurement systems.

Prior known amplifier circuits have used feedforward superposition to isolate amplifier generated noise and subsequently cancel the amplifier generated noise in the output signal. Such amplifier circuits are subject to drift due to time, temperature and power variations. Amplifier characteristics also vary for different signal frequencies within the amplifier bandwidth. Many prior known feedforward amplifier circuits were optimized during initial setup and did not provide automatic compensation for drift and frequency variation.

Prior known amplifier circuits have used feedback modulation of the input signal to attempt to suppress amplifier generated noise. Attempts to combine feedforward superposition and modulation have generally resulted in rather complex amplifier circuits. U.S. Pat. No. 5,760,646 to Belcher et al. discloses an amplifier circuit that uses complex work functions to attempt to predistort the input signal to an amplifier. U.S. Pat. No. 6,087,898 to Baskin discloses a complex amplifier circuit that uses a pilot tone and two feedforward loops to attempt to suppress amplifier generated noise.

A relatively simple, cost effective amplifier circuit that provides automatic compensation for drift due to time, temperature, and power variations, and to frequency variation is desirable.

DISCLOSURE OF THE INVENTION

A noiseless amplifier circuit includes an input port, an output port, a primary amplifier, first, second and third circuits, and first and second controls. The amplifier has an input for receiving an input signal from the input port and an output for transmitting an amplified output signal to the output port. The first circuit receives, modulates and combines the input and output signals to isolate the amplifier generated noise and also provides amplification of the input signal.

The second circuit superimposes the amplifier generated noise onto the output signal to remove the amplifier generated noise from the output signal. The third circuit receives and modulates the input signal, and receives the amplifier generated noise, to modulate the input signal at the input of the amplifier. The first control controls the modulation in the first circuit to keep balanced the combination of the input and output signals and overcome amplifier drift. The second control controls the modulation in the second circuit to keep balanced the superposition of the amplifier generated noise onto the output signal.

BRIEF DESCRIPTION OF THE DRAWINGS

Details of this invention are described in connection with the accompanying drawings that bear similar reference numerals in which.

DETAILED DESCRIPTION OF THE INVENTION

Figure 1:
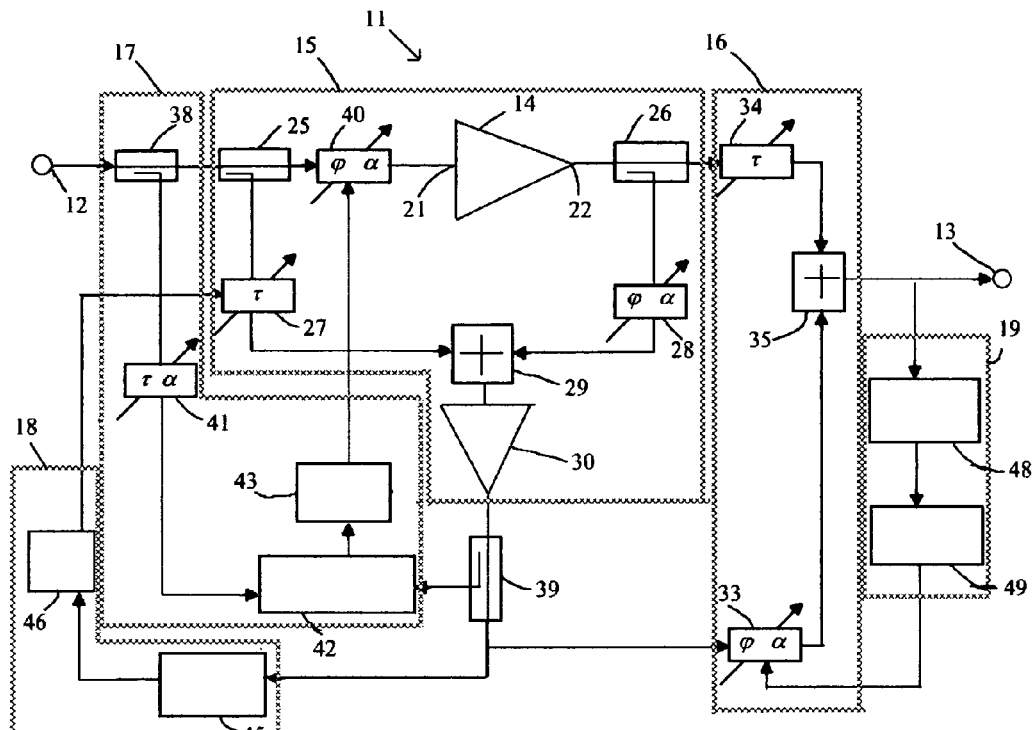
FIG. 1 is a schematic circuit diagram of an amplifier circuit embodying the features of the present invention.

Referring now to FIG. 1, an amplifier circuit 11 embodying features of present invention includes an input port 12, an output port 13, a primary amplifier 14, a first circuit 15, a second circuit 16, a third circuit 17, a first control 18 and a second control 19. An input signal is input into the amplifier circuit 11 at the input port 12 and an output signal is output from the amplifier circuit 11 at the output port 13. The primary amplifier 14 includes an input 21 for receiving the input signal and an output 22 for outputting the output signal.

The first circuit 15 is a means for providing the desired gain and isolating the amplifier generated noise in the output signal. The first circuit 15 includes a directional first coupler 25, connected between the input port 12 and the input 21 of the primary amplifier 14, and a directional second coupler 26, connected between the output 22 of the primary amplifier 14 and the output port 13. A first modulator 27, shown as a delay unit, connects to the first coupler 25 and a second modulator 28, shown as a variable attenuator and variable phase shifter, connects to the second coupler 26. A first combiner 29 connects to the first and second modulators 27 and 28, and to an error amplifier 30.

The second circuit 16 is a means for superpositioning and phase inverting the amplifier generated noise onto the output signal to cancel the amplifier generated noise from the output signal, and includes a third modulator 33, a fourth modulator 34 and a second combiner 35. The third modulator 33 is shown as a variable attenuator and variable phase shifter, and connects between the error amplifier 30 and the second combiner 35. The fourth modulator 34 is shown as a variable delay unit, and connects to the second coupler 26 and the second combiner 35. The second combiner 35 connects to the output port 13.

The third circuit 17 is a means for modulating the input signal or the output signal in response to the amplifier generated noise to provide feedback or feedforward, respectively, compensation of the amplifier generated noise. In the illustrated embodiment, the third circuit 15 is a feedback configuration, and includes a directional third coupler 38, a directional fourth coupler 39, a fifth modulator 40, a sixth modulator 41, a first detector 42 and a first loop filter 43. The third coupler 38 connects to the input port 12 and to the first coupler 25. The fourth coupler 39 connects to the error amplifier 30 and the third modulator 33. The fifth modulator 40 is shown as a variable attenuator and variable phase shifter, and connects to the first coupler 25 and to the input 21 of the primary amplifier 14. The sixth modulator 41 is shown as a variable attenuator and variable delay unit, and connects to the third coupler 38. The first detector 42 connects to the fourth coupler 39 and to the sixth modulator 41. The loop filter 43 connects to the first detector 42 and to the fifth modulator 40.

The first control 18 is a means for maintaining phase and amplitude balance at the first combiner 29, and includes a second detector 45 connected to the fourth coupler 39, and a second loop filter 46 connected to the second detector 45 and to the first modulator 27. The second control 19 is a means for maintaining phase and amplitude balance at the second combiner 35, and includes a third detector 48 connected between the second combiner 35 and the output port 13, and a third loop filter 49 connected to the third detector 48 and to the third modulator 33.

The input signal proceeds from the input port 12 through the third coupler 38, the first coupler 25, and the fifth modulator 40 to the input 21 of the primary amplifier 14. The amplified output signal proceeds from the output 22 of the primary amplifier 14 through the second coupler 26, the fourth modulator 34 and the second combiner 35 to the output port 13. The input signal includes a carrier and input noise while the output signal, at the output 22 of the primary amplifier 14, includes the amplified carrier and input noise, and amplifier generated noise.

In the first circuit 15, a portion of the input signal is tapped at the first coupler 25 and passed through the first modulator 27 to the first combiner 29 while a portion of the output signal is tapped at the second coupler 26 and passed through the second modulator 28 to the first combiner 29. The first and second modulators 27 and 28 modulate the input and output signals to match that the amplitude and to adjust the phase of the carriers of the input and output signals to be at 180 degrees relative to each other, so that the carriers and input noise cancel each other in the first combiner 29, and the output of the first combiner 29 is the amplifier generated noise. The amplifier generated noise is amplified in the error amplifier 30.

In the second circuit 16, the output signal is received from the output 22 of the primary amplifier 14 at the fourth modulator 34, modulated therein, and transmitted to the second combiner 35. The amplifier generated noise is received at the third modulator 33, modulated therein, and transmitted to the second combiner 35. The third and fourth modulators 33 and 34 match the amplitude and shift the relative phase by 180 degrees of the amplifier generated noise in the output signal and the amplifier generated noise from the first circuit 15. The second combiner 35 combines the modulated output signal and amplifier generated noise from the first circuit 15, and thereby cancels the amplifier generated noise from the output signal that is transmitted to the output port 13.

In the third circuit 17, a portion of the input signal is tapped at the third coupler 38, transmitted to the sixth modulator 41, modulated therein, and transmitted to the first detector 42 for use as a reference signal. A portion of the amplifier generated noise is tapped at the fourth coupler 39 and transmitted to the first detector 42. The first detector 42 mixes the input signal and the amplifier generated noise, which transfers or downconverts the amplifier generated noise around frequency other than the frequency of the carrier, and separates the amplitude fluctuations from the phase fluctuations. Generally the amplifier generated noise is transferred around DC. The first detector 42 produces a first control signal that is transmitted to the first loop filter 43, processed therein, and transmitted to the fifth modulator 40 to control the fifth modulator 40. The fifth modulator 40 modulates the input signal before the input signal is received at the input 21 of the primary amplifier 14 to compensate for the amplifier generated noise.

The first and second controls 18 and 19 were not included in the above referenced provisional application. In the first control 18, the amplifier generated noise is received by the second detector 45, which produces a second control signal that is processed by the second loop filter 46. The second control signal is transmitted to the first modulator 27 to control the first modulator 27 and thereby keep the amplitude and phase balance at the first combiner 29. In the second control 19, the output signal, after the second combiner 35, is received by the third detector 48, which produces a third control signal that is processed by the third loop filter 49. The second control signal is transmitted to the third modulator 33 to control the third modulator 33 and thereby keep the amplitude and phase balance at the second combiner 35.

The variable phase shift may be incorporated into either the first or second modulator 27 or 28 in the first circuit 15, and into either the third or fourth modulator 33 or 34 in the second circuit 16. The first control 18 can be implemented to control either the first or second modulator 27 or 28, and can also be integrated into the third circuit 17. The second control 19 can be implemented to control either the third or fourth modulator 33 or 34. The third circuit 17 can also be implemented in a feedforward configuration, with the fifth modulator 40 being connected between the second coupler 26 and the fourth modulator 34. The first detector 42 may incorporate circuitry that isolates the amplifier generated noise and thereby can be connected to the output 22 of the primary amplifier 14 instead of being connected to the error amplifier 30.

The first, second and third loop filters 43, 46 and 49 are each generic low pass circuits. The first, second and third detectors 42, 45 and 48, and the first, second and third loop filters 43, 46 and 49 may be implemented, by way of example, and not as a limitation, with analog circuitry and/or with special purpose digital circuitry. The third detector 48 may incorporate circuitry that compares the amplifier noise with its copy and thereby can be connected to the outputs of the third and fourth modulators 33 and 34 instead of being connected at the output port 13.

Figure 2:
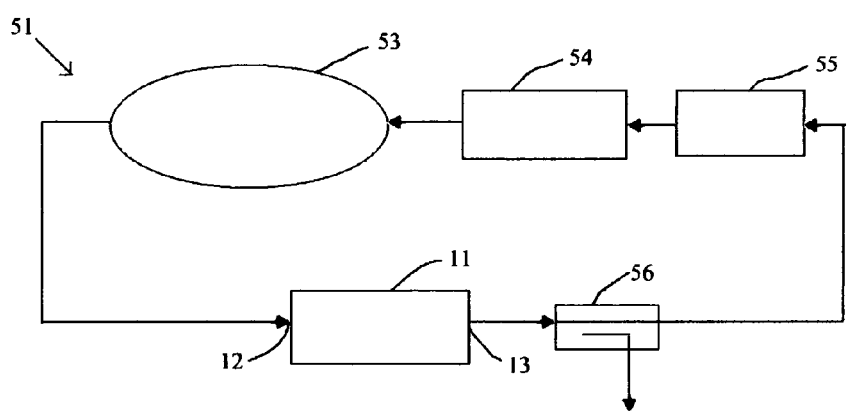
FIG. 2 is a schematic circuit diagram of an oscillator circuit with the amplifier circuit of FIG. 1.

FIG. 2 shows an oscillator circuit 51 incorporating a noiseless amplifier circuit 11. The oscillator circuit 51 includes a resonator 53 connected to the input port 12 of the amplifier circuit 11, a phase modulator 54 connected to the resonator 53, a limiting network 55 connected to the phase modulator 54 and a fifth coupler 56 connected between the limiting network 55 and the output port 13 of the amplifier circuit 11. The output of the oscillator circuit 51 is sampled through the fifth coupler 56. The element limiting noise performance in oscillators, especially above a few GHz, is the amplifier. Since the gain in the oscillator circuit 51 with the amplifier circuit 11 is virtually without noise, performance of oscillator circuit 51 is only limited by the other elements in the loop, and is generally outstanding.

Figure 3:
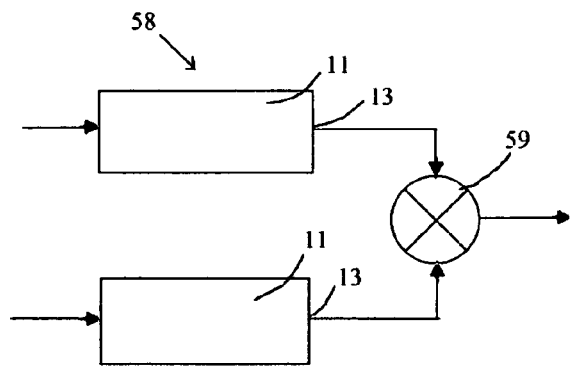
FIG. 3 is a schematic circuit diagram of a mixer circuit with the amplifier circuit of FIG. 1.
Figure 4A:
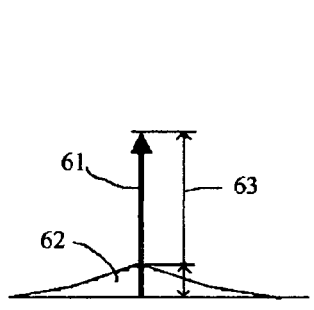
FIG. 4A is a pictorial representation of an input signal.
Figure 4B:
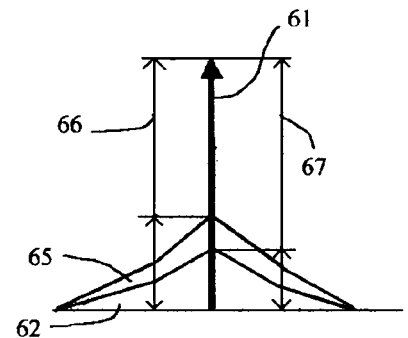
FIG. 4B is a pictorial representation of an output signal including amplifier generated noise.

FIG. 3 shows a mixer circuit 58 having a frequency mixer 59 connected to the output ports 13 of two amplifier circuits 11. FIG. 4A shows an input signal including a carrier 61 and input noise 62, and has input signal to noise ratio 63. In FIG. 4B an output signal, the amplified input signal, includes the amplified carrier 61 and input noise 62, and amplifier generated noise 65. The first output signal to noise ratio 66 represents the signal to noise ratio without the noiseless amplification of the present invention and is less than the input signal to noise ratio 63. The second output signal to noise ratio 67 represent the signal to noise ratio of the amplifier circuit 11 of the present invention, and is equal to the input signal to noise ratio 63.

Figure 5A:
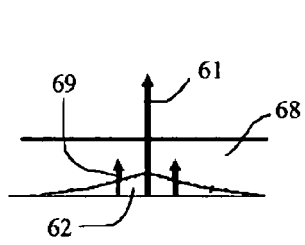
FIG. 5A is a pictorial representation of an output signal from a mixer circuit without amplification.
Figure 5B:
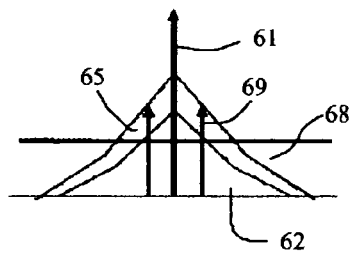
FIG. 5B is a pictorial representation of an output signal from a mixer circuit with amplification and without noise suppression.
Figure 5C:
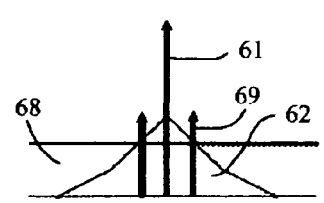
FIG. 5C is a pictorial representation of an output signal from a mixer circuit with amplification from amplifier circuits embodying the features of the present invention.

FIG. 5A shows the output signal of a mixer circuit without amplification of the input signals, including the carrier 61, input noise 62, mixer generated noise 68 and modulation sidebands 69. The modulation sidebands 69 do not extend above the mixer generated noise 68, so the mixer generated noise 68 prevents recovery of the modulation sidebands 69. FIG. 5B shows the output signal of a mixer circuit with amplification of the input signals, but without noiseless amplification. The amplifier generated noise 65 extends above the mixer generated noise 68. The modulation sidebands 69 extend above the mixer generated noise 68 but do not extend above the amplifier generated noise 65, so the amplifier generated noise 65 prevents recovery of the modulation sidebands 69. FIG. 5C shows the output signal of a mixer circuit with amplification of the input signals with the amplifier circuit 11 of the present invention. The modulation sidebands 69 extend above the mixer generated noise 68, the amplifier generated noise 65 is suppressed, and the modulation sidebands 69 are recoverable.

Although the present invention has been described with a certain degree of particularity, it is understood that the present disclosure has been made by way of example and that changes in details of structure may be made without departing from the spirit thereof.

What is claimed is:

1. An amplifier circuit, for providing noiseless amplification of an input signal having a carrier, comprising:
   a primary amplifier having an input for receiving said input signal and an output for providing an amplified output signal,
   a first circuit means, connected to said input and said output, for isolating amplifier generated noise, said first circuit means including a first modulator connected to said input, a second modulator connected to said output, a first combiner connected to said first and second modulators and an error amplifier connected to said first combiner,
   whereby said first and second modulators receive and modulate said input and output signals, respectively, to match the amplitude and shift the phase by 180 degrees of said input and output signals, and said first combiner combines said input and output signals to isolate said amplifier generated noise,
   a second circuit means, connected to said first circuit means and to said output, for superpositioning said amplifier generated noise onto said output signal to cancel said amplifier generated noise from said output signal, and
   a third circuit means, connected to said input and to said first circuit means, for mixing said input signal and amplifier generated noise to produce a first control signal, and modulating one of said input signal and said output signal in response to said first control signal.

2. The amplifier circuit as set forth in claim 1 wherein said first modulator includes a variable delay, said second modulator includes a variable attenuator, and one of said first and second modulators includes a variable phase shifter.

3. The amplifier circuit as set forth in claim 2 including a first control having a detector connected to said error amplifier, a loop filter connected to said detector and to one of said first and second modulators,
   whereby said first control controls said one of said first and second modulators and thereby keeps amplitude and phase balanced at said first combiner.

4. The amplifier circuit as set forth in claim 1 wherein said second circuit means includes a third modulator connected to said first circuit means, a fourth modulator connected to said output, and a second combiner connected to said third and fourth modulators,
   whereby said third and fourth modulators receive and modulate said amplifier generated noise and said output signal, respectively, to match the amplitude and shift the phase by 180 degrees of said amplifier generated noise and said output signal, and said second combiner combines said amplifier generated noise and said output signal to cancel said amplifier generated noise from said output signal.

5. The amplifier circuit as set forth in claim 4 wherein third modulator includes a variable attenuator, said fourth modulator includes a variable delay, and one of said third and fourth modulators includes a variable phase shifter.

6. The amplifier circuit as set forth in claim 5 including a second control having a detector connected to said second combiner, a loop filter connected to said detector and to one of said third and fourth modulators,
   whereby said second control controls said one of said third and fourth modulators and thereby keeps amplitude and phase balanced at said second combiner.

7. The amplifier circuit as set forth in claim 4 wherein said third circuit means includes a fifth modulator, a sixth modulator connected to said input for receiving said input signal, a detector connected to said fifth modulator and to said first circuit means, a loop filter connected to said detector and to said fifth modulator, said detector receiving said input signal from said fifth modulator and said amplifier generated noise from said first circuit means, using said input signal as a reference, downconverting said amplifier generated noise to around a frequency other than the frequency of said carrier, and separating amplitude fluctuations from phase fluctuations, and therefrom generating a control signal, and said fifth modulator receiving said input signal and said control signal, modulating said input signal in response to said control signal and transmitting said input signal to said primary amplifier.

8. The amplifier circuit as set forth in claim 7 wherein said fifth modulator includes a variable phase shifter and a variable attenuator, and said sixth modulator includes a variable delay and a variable attenuator.

9. An amplifier circuit, for providing noiseless amplification of an input signal having a carrier, comprising:
   a primary amplifier having an input for receiving said input signal and an output for providing an amplified output signal,
   a first circuit having a first modulator with a variable delay connected to said input, a second modulator with a variable phase shifter and a variable attenuator connected to said output, a first combiner for combining said input signal from said first modulator and said output signal from said second modulator and isolating thereby amplifier generated noise, and an error amplifier for receiving said amplifier generated noise from said first combiner and amplifying said amplifier generated noise, a second circuit having third modulator with a variable delay connect to said output, a fourth modulator with a variable phase shifter and a variable attenuator connected to said error amplifier, and a second combiner configure to receive said output signal from said third modulator, to receive said amplifier generated noise from said fourth modulator, and to superposition said output signal and said amplifier generated noise to cancel said amplifier generated noise from said output signal, and a third circuit having a fifth modulator with a variable phase shifter and a variable attenuator, a sixth modulator with a variable delay and a variable attenuator and connected to said input for receiving said input signal, a first detector connected to said fifth modulator and to said error amplifier, a loop filter connected to said first detector and to said fifth modulator, said first detector for receiving said input signal from said fifth modulator and said amplifier generated noise from said error amplifier, using said input signal as a reference to downconvert said amplifier generated noise to around a frequency other than the frequency of said carrier, and separating amplitude fluctuations from phase fluctuations, and therefrom to generating a first control signal, and said fifth modulator for receiving said input signal and said first control signal, modulating said input signal in response to said first control signal and transmitting said input signal to said primary amplifier.

10. The amplifier circuit as set forth in claim 9 including a first control having a second detector connected to said error amplifier, a second loop filter connected to said second detector and to said first modulator, whereby said first control controls said first modulator to keep amplitude and phase balanced at said first combiner.

11. The amplifier circuit as set forth in claim 10 including a second control having a third detector connected to said second combiner, a third loop filter connected to said third detector and to said third modulator, whereby said second control controls said third modulator to keep amplitude and phase balanced at said second combiner.

12. An oscillator circuit comprising:

a resonator, a phase modulator connected to said resonator, an amplifier circuit connected to said resonator and said phase modulator, for providing noiseless amplification of an input signal having a carrier, said amplifier circuit including:

a primary amplifier having an input for receiving said input signal and an output for providing an amplified output signal, a first circuit means, connected to said input and said output, for isolating amplifier generated noise, said first circuit means including a first modulator connected to said input, a second modulator connected to said output, a first combiner connected to said first and second modulators and an error amplifier connected to said first combiner, whereby said first and second modulators receive and modulate said input and output signals, respectively, to match the amplitude and shift the phase by 180 degrees of said input and output signals, and said first combiner combines said input and output signals to isolate said amplifier generated noise, a second circuit means, connected to said first circuit means and to said output, for superpositioning said amplifier generated noise onto said output signal to cancel said amplifier generated noise from said output signal, and a third circuit means, connected to said input and to said first circuit means, for mixing said input signal and amplifier generated noise to produce a first control signal, and modulating one of said input signal and said output signal in response to said first control signal.

13. A mixer circuit comprising:

first and second amplifier circuits, each for providing noiseless amplification of an input signal having a carrier and each including:

a primary amplifier having an input for receiving said input signal and an output for providing an amplified output signal, a first circuit means, connected to said input and said output, for isolating amplifier generated noise, said first circuit means including a first modulator connected to said input, a second modulator connected to said output, a first combiner connected to said first and second modulators and an error amplifier connected to said first combiner, whereby said first and second modulators receive and modulate said input and output signals, respectively, to match the amplitude and shift the phase by 180 degrees of said input and output signals, and said first combiner combines said input and output signals to isolate said amplifier generated noise, a second circuit means, connected to said first circuit means and to said output, for superpositioning said amplifier generated noise onto said output signal to cancel said amplifier generated noise from said output signal, and a third circuit means, connected to said input and to said first circuit means, for mixing said input signal and amplifier generated noise to produce a first control signal, and modulating one of said input signal and said output signal in response to said first control signal, and a frequency mixer connected to said first and second amplifier circuits and configure to receive and mix said output signals from said first and second amplifier circuits.

* * * * *